United States Patent
Hwang (10) Patent No.: US 8,424,195 B2
(45) Date of Patent: Apr. 23, 2013

(54) APPARATUS FOR MANUFACTURING SEMICONDUCTOR PACKAGE FOR WIDE LEAD FRAME AND METHOD OF CONSTRUCTING SEMICONDUCTOR PACKAGE USING THE SAME

(75) Inventor: Sun Ha Hwang, Chungcheongnam-Do (KR)

(73) Assignee: STS Semiconductor & Telecommunications Co., Ltd., Chungcheongnam-Do (KR)

( * ) Notice: Subject to any disclaimer, the term of this patent is extended or adjusted under 35 U.S.C. 154(b) by 1081 days.

(21) Appl. No.: 12/393,607

(22) Filed: Feb. 26, 2009

(65) Prior Publication Data
US 2009/0269887 A1 Oct. 29, 2009

(30) Foreign Application Priority Data
Apr. 25, 2008 (KR) ........................ 10-2008-0038988

(51) Int. Cl.
*B23P 19/04* (2006.01)
(52) U.S. Cl.
USPC .................. 29/740; 29/831; 29/834; 29/742; 29/743; 29/759; 29/823; 29/240; 257/666; 257/E23.031; 257/E23.043; 257/E23.052; 438/107; 438/111; 438/123; 438/455
(58) Field of Classification Search ............. 29/240, 29/831, 834, 729, 739–743, 759–761, 771, 29/783, 791, 794, 795, 822–824; 257/666–786, 257/798, E21.001–E21.705, E25.001–E24.032, 257/E23.031–E23.077, FOR. 121, FOR. 340, 257/FOR. 365, FOR. 366, FOR. 369, FOR. 380, 257/FOR. 381, FOR. 437; 438/107, 123, 438/455, 106, 110–111, 118, 121; 228/1.1, 228/4.1, 4.5, 5.7, 6.2, 9, 43, 49.1, 49.2, 101, 228/110.1, 179.1, 180.1, 180.21, 180.5
See application file for complete search history.

(56) References Cited

U.S. PATENT DOCUMENTS

| 4,854,494 A | 8/1989 | Von Raben |
| 5,238,174 A | 8/1993 | Ricketson |

(Continued)

FOREIGN PATENT DOCUMENTS

| JP | 05-013517 | | 1/1993 |
| JP | H05-013517 | * | 1/1993 |

(Continued)

OTHER PUBLICATIONS

English language translation of First Office Action regarding Chinese Patent Application No. 200910132099.X dated Apr. 26, 2010.

(Continued)

*Primary Examiner* — Fernando L Toledo
*Assistant Examiner* — Victoria K Hall
(74) *Attorney, Agent, or Firm* — Lathrop & Gage LLP (57) ABSTRACT

An apparatus for manufacturing a semiconductor package includes an index rail transferring a lead frame in forward and backward directions, the lead frame having a first surface and a second surface that is opposite to the first surface, a loader portion connected to an end portion of the index rail and supplying the lead frame to the index rail, a frame driving portion connected to the opposite end portion of the end portion of the index rail and rotating the lead frame around a normal to the first surface, and a die attach portion attaching a semiconductor chip on the lead frame supplied to the index rail.

20 Claims, 9 Drawing Sheets

U.S. PATENT DOCUMENTS

| | | | |
|---|---|---|---|
| 5,279,045 A * | 1/1994 | Odashima et al. | 34/360 |
| 5,465,899 A | 11/1995 | Quick et al. | |
| 5,566,876 A | 10/1996 | Nishimaki et al. | |
| 5,979,739 A | 11/1999 | Jin et al. | |
| 6,705,001 B2 | 3/2004 | How et al. | |
| 6,827,247 B1 | 12/2004 | Fan et al. | |
| 7,568,606 B2 | 8/2009 | Wong et al. | |
| 7,677,431 B2 * | 3/2010 | Wong et al. | 228/179.1 |
| 7,934,632 B2 | 5/2011 | Hwang | |
| 2005/0006743 A1 * | 1/2005 | Kim et al. | 257/685 |
| 2009/0269889 A1 | 10/2009 | Hwang | |

FOREIGN PATENT DOCUMENTS

| | | | |
|---|---|---|---|
| JP | 10-125699 | | 5/1998 |
| JP | 2001-024396 | | 1/2001 |
| JP | 2001-127082 | * | 5/2001 |
| JP | 2002-164361 | | 6/2002 |
| JP | 2005-277351 | | 10/2005 |
| JP | 2009-106735 | | 5/2009 |
| JP | 2009-267414 | | 11/2009 |
| KR | 10-0208481 | | 4/1999 |
| KR | 100208481 | | 4/1999 |

OTHER PUBLICATIONS

English language translation of First Office Action regarding Chinese Patent Application No. 200910132098.5 dated Apr. 23, 2010.

Office Action regarding U.S. Appl. No. 12/393,651 dated May 26, 2010.

Office Action regarding U.S. Appl. No. 12/393,651 dated Nov. 16, 2010.

Notice of Allowability issued Dec. 30, 2010 regarding U.S. Appl. No. 12/393,651 (issued May 3, 2011 as U.S. Patent No. 7,934,632).

* cited by examiner

APPARATUS FOR MANUFACTURING SEMICONDUCTOR PACKAGE FOR WIDE LEAD FRAME AND METHOD OF CONSTRUCTING SEMICONDUCTOR PACKAGE USING THE SAME

CROSS-REFERENCE TO RELATED PATENT APPLICATIONS

This application claims the benefit of Korean Patent Application No. 10-2008-0038988, filed on Apr. 25, 2008, in the Korean Intellectual Property Office, the disclosure of which is incorporated herein in its entirety by reference.

BACKGROUND OF THE INVENTION

1. Field of the Invention

The present invention relates to an apparatus for and method of manufacturing a semiconductor package, and more particularly, to an apparatus for and method of constructing a semiconductor package by performing a die attach process with respect to a wide lead frame.

2. Description of the Related Art

As use of mobile phones and laptops has constantly increased, such electronic apparatuses have been developed to be more compact, lighter, and have more functions. Accordingly, electronic parts used for use in these electronic apparatuses need to be made smaller and with higher integration density. To meet these needs, along with a method of highly integrating a semiconductor chip to decrease its size, a method of mounting a semiconductor chip using a multi-chip packaging technology has been widely used.

Figure 1:
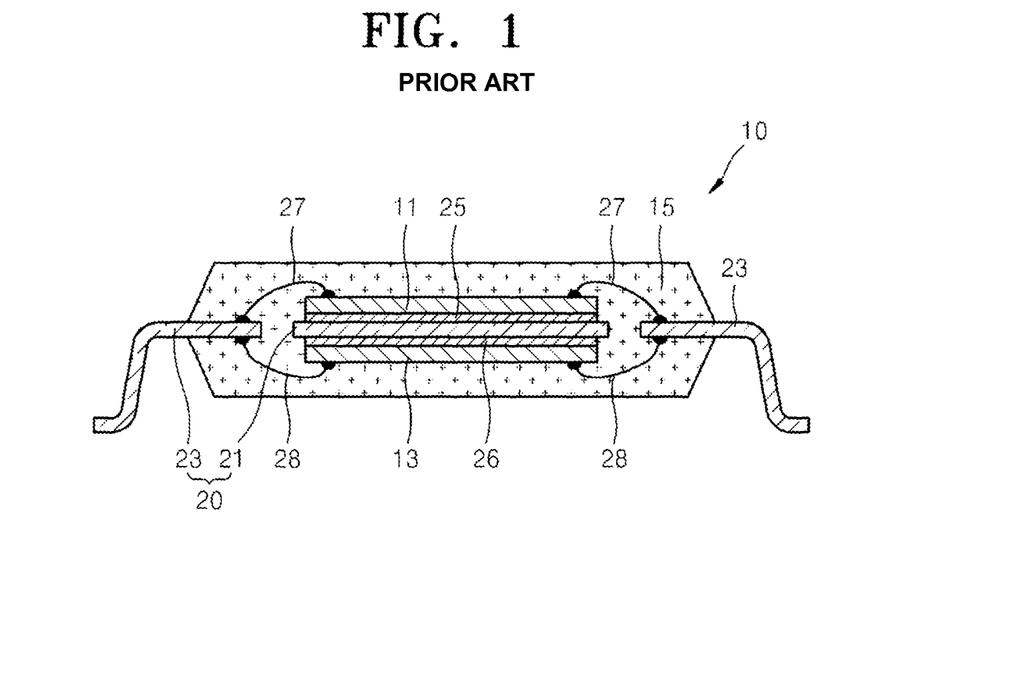
FIG. 1 is a cross-sectional view illustrating the structure of a conventional dual die package (DDP)

FIG. 1 is a cross-sectional view illustrating the structure of a conventional dual die package (DDP) 10. Referring to FIG. 1, two semiconductor chips, that is, first and second semiconductor chips 11 and 13, are mounted on a lead frame 20. The lead frame 20 includes a die pad 21 and a lead finger 23. The first and second semiconductor chips 11 and 13 are respectively attached on the upper and lower surfaces of the die pad 21 via first and second adhesive layers 25 and 26. The first and second semiconductor chips 11 and 13 are electrically connected to the lead finger 23 via wire bonds 27 and 28. The first and second semiconductor chips 11 and 13, the wire bonds 27 and 28, and their junction portions are sealed by a molding resin 15 such as epoxy molding compound so as to be protected from an external environment.

Figure 2:
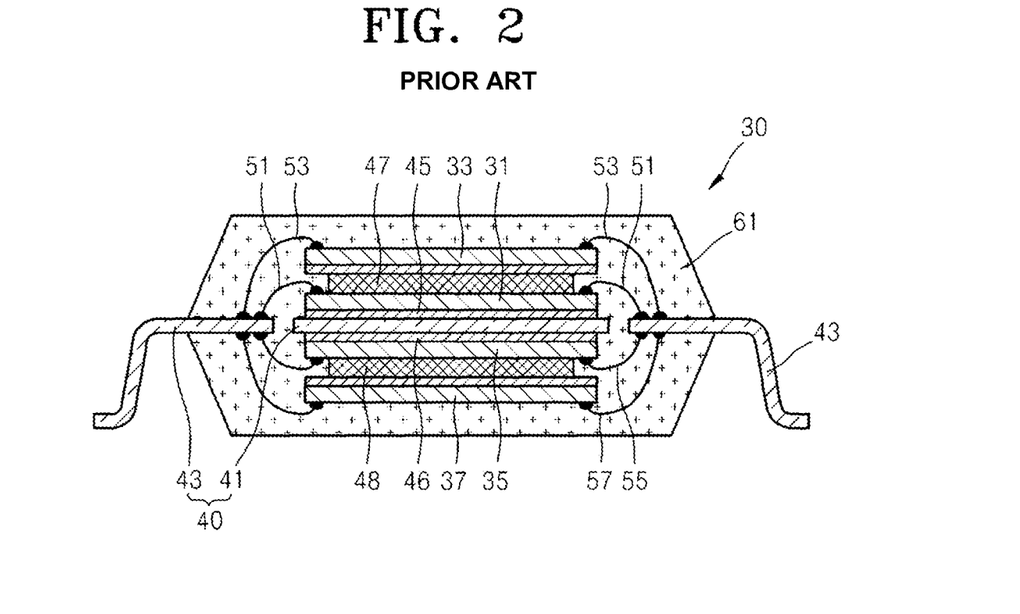
FIG. 2 is a cross-sectional view illustrating the structure of a conventional quad die package (QDP)

FIG. 2 is a cross-sectional view illustrating the structure of a conventional quad die package (QDP) 20. Referring to FIG. 2, four semiconductor chips are mounted on a lead frame 40 including a die pad 41 and a lead finger 43. That is, first and second semiconductor chips 31 and 33 are sequentially deposited on the upper surface of the die pad 41 by being attached to first and second adhesive layers 45 and 47. Third and fourth semiconductor chips 35 and 37 are sequentially deposited on the lower surface of the die pad 41 by being attached to third and fourth adhesive layers 46 and 48. The first through fourth semiconductor chips 31, 33, 35, and 37 are electrically connected to the lead finger 43 via wire bonds 51, 53, 55, and 57. The first through fourth semiconductor chips 31, 33, 35, and 37, the wire bonds 51, 53, 55, and 57, and their junction portions are sealed by a molding resin 61 such as epoxy molding resin.

The process of manufacturing a single semiconductor chip package and a semiconductor package using a lead frame in the DDP and QDP structures shown in FIGS. 1 and 2 includes a die attach process for separating a unit semiconductor chip from a wafer where integrated circuits (ICs) are formed and attaching the separated unit semiconductor chip to a lead frame, a wire bonding process for bonding the semiconductor chip and the lead frame using a conductive metal wire so as to be electrically connected therebetween, a molding process for molding the electrically connected parts with molding resin to protect them from an external environment, a trim/form process for cutting and bending the lead finger that protrudes outside, and a test process for testing reliability of a complete IC chip package.

In the conventional semiconductor package manufacturing process, the lead frame is used for providing a place for mounting a semiconductor chip and as a means for an electrical connection. In this regard, as the competition in the market and development of semiconductor device technology has increased, productivity and cost reduction become more important issues. Typically, the lead frame is manufactured in a strip shape so that eight to ten semiconductor packages can be simultaneously manufactured. However, in order to increase the number of the semiconductor packages to be manufactured using a single lead frame, a wide lead frame having a wide width has been developed so that a number of semiconductor packages can be manufactured not only in the lengthwise direction of the lead frame but also in the widthwise direction of the lead frame.

However, in order to use the wide lead frame, a semiconductor package manufacturing equipment is necessary and the costs for developing and manufacturing such equipment is high. Furthermore, the semiconductor chip package manufacturing process for multi-chip packaging requires a manual step so that process time increases due to a process delay, and accordingly productivity deteriorates.

SUMMARY OF THE INVENTION

To solve the above and/or other problems, the present invention provides an apparatus for manufacturing a semiconductor chip package using a wide lead frame.

Also, the present invention provides a method of constructing a semiconductor chip package using a wide lead frame so that the manufacturing cost is reduced and productivity is improved.

According to an aspect of the present invention, an apparatus for manufacturing a semiconductor package comprises an index rail transferring a lead frame in forward and backward directions, the lead frame having a first surface and a second surface that is opposite to the first surface, a loader portion connected to an end portion of the index rail and supplying the lead frame to the index rail, a frame driving portion connected to the opposite end portion of the end portion of the index rail and rotating the lead frame around a normal to the first surface, and a die attach portion attaching a semiconductor chip on the lead frame supplied to the index rail.

The die attach portion comprises an attach head picking the semiconductor chip up and attaching the semiconductor chip to the lead frame and a transfer rail transferring the attach head over the index rail.

The attach head moves along the transfer rail in a widthwise direction of the index rail from one end of the index rail in the widthwise direction at least to the center position of the width of the index rail.

The apparatus further comprises an unloading portion connected to the frame driving portion to exhaust the lead frame to the outside of the apparatus, wherein the frame driving portion selectively transfers the lead frame to the unloading portion or supplies the lead frame back to the index rail according to the state of the lead frame.

To rotate the lead frame around a normal to the first surface, the frame driving portion comprises a frame loading rail supporting the lead frame, a rotary table supporting the frame loading rail, a rotational shaft connected to the rotary table in a direction along the normal to the first surface, and a rotation driving apparatus supplying a rotation driving force to the rotation shaft.

The frame loading rail supports the lead frame so that the frame driving portion rotates the lead frame one for each time.

The frame driving portion rotates the lead frame by 180°.

The loader portion has an unloading function to exhaust the lead frame transferred from the index rail to the outside of the apparatus.

The frame driving portion further comprises a reversing apparatus which reverses the lead frame so that one surface facing upward from the first and second surfaces of the lead frame faces downward.

According to another aspect of the present invention, an apparatus for manufacturing a semiconductor package comprises a first die attach apparatus and a second die attach apparatus, each comprising an index rail transferring a lead frame having a first surface and a second surface that is opposite to the first surface in forward and backward directions and a die attach portion attaching a semiconductor chip on the lead frame placed on the index rail, a loader portion connected to an end portion of the first die attach apparatus and supplying the lead frame to the first die attach apparatus, an unloader portion connected to an end portion of the second die attach apparatus and exhausting the lead frame from the second die attach apparatus, and a frame driving portion connected between the opposite end portions of the end portions of the first and second die attach apparatuses and rotating the lead frame around a normal to the first surface.

The frame driving portion selectively transfers the lead frame to the first die attach apparatus or the second die attach apparatus according to the state of the lead frame.

According to another aspect of the present invention, a method of manufacturing a semiconductor package comprises supplying a lead frame having a first surface having a plurality of die pads and a second surface opposite to the first surface, with the first surface facing upward, to a die attach portion, wherein the lead frame is moved in a first direction, attaching a semiconductor chip in some of the die pads on the first surface of the lead frame in the die attach portion (a first die attach operation), rotating the lead frame around a normal to the first surface, and attaching the semiconductor chip in the rest of the die pads on the first surface of the lead frame where the semiconductor chip is not attached, in the die attach portion (a second die attach operation).

The method further comprises reversing the lead frame so that the second surface of the lead frame faces upward, wherein the second surface has a plurality of die pads, attaching the semiconductor chip in some of the die pads on the second surface of the lead frame in the die attach portion (a third die attach operation), rotating the lead frame around a normal to the second surface, and attaching the semiconductor chip in the rest of the die pads on the second surface of the lead frame where the semiconductor chip is not attached, in the die attach portion (a fourth die attach operation).

In the first die attach operation, the semiconductor chip is attached on all of the die pads displaced at least in a half portion with respect to a centerline of the first surface extending in the first direction. In the second die attach operation, the semiconductor chip is attached on all of the die pads displaced at least in a half portion with respect to a centerline of the first surface extending in the first direction.

In the third die attach operation, the semiconductor chip is attached on all of the die pads displaced at least in a half portion with respect to a centerline of the second surface extending in the first direction. In the fourth die attach operation, the semiconductor chip is attached on all of the die pads displaced at least in a half portion with respect to a centerline of the second surface in the first direction.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements. The terms used herein are merely for the purpose of explanation of the present invention, not for limiting the meaning or scope of the present invention defined in the attached claims.

Figure 3:
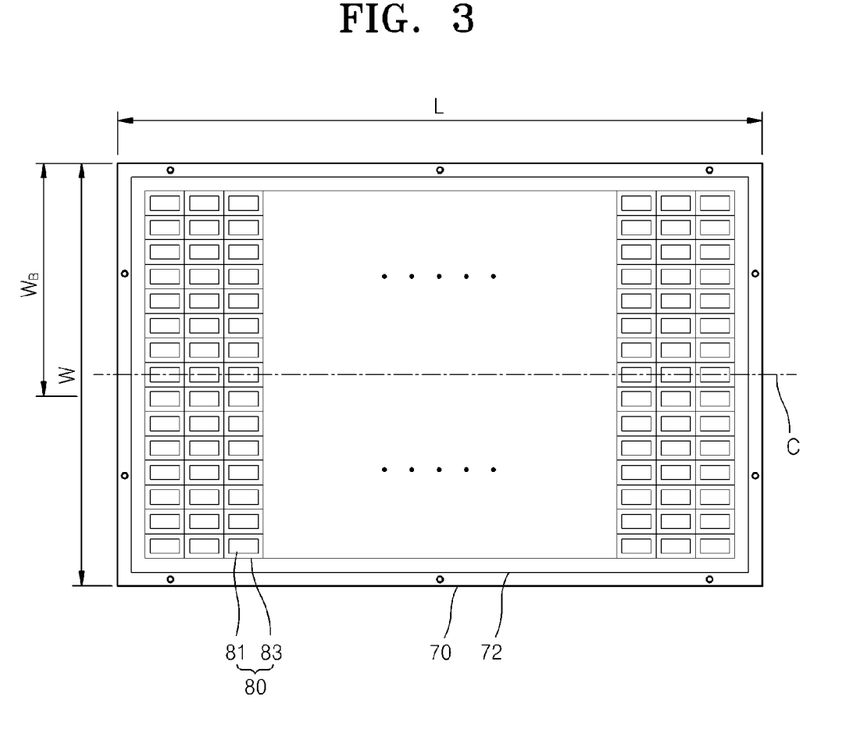
FIG. 3 is a plan view of a wide lead frame for manufacturing a semiconductor package according to an embodiment of the present invention.

FIG. 3 is a plan view of a wide lead frame 70 for manufacturing a semiconductor package according to an embodiment of the present invention. Referring to FIG. 3, a plurality of unit lead frames 80 are repeatedly arranged on the wide lead frame 70 in both of a lengthwise direction L and a widthwise direction W of the wide lead frame 70. The lengthwise direction L of the wide lead frame 70 means a direction in which the wide lead frame 70 moves in a die attach process. Each of the unit lead frames 80 includes a die pad 81 and a lead finger portion 83. The wide lead frame 70 undergoes the processes of semiconductor chip attachment and electrical connection and simultaneously the process of depositing a molding resin on a molding area 72, and then is separated into individual semiconductor packages, thereby manufacturing a plurality of semiconductor packages. Accordingly, as the wide lead frame 70 includes more number of the unit lead frames 80, the size of the edge portion of the wide lead frame 70 that will be lost decreases so that the manufacturing cost is reduced and productivity is improved.

As it will be described in detail later, to attach a semiconductor chip to the die pad 81 of the wide lead frame 70, the semiconductor chip is moved toward the wide lead frame 70 via an attach head (not shown). In general, the wide lead frame 70 moves along an index rail (not shown) in the lengthwise direction L. The attach head usually moves in the widthwise direction W of the wide lead frame 70 to attach the semiconductor chip to the die pad 81. A width centerline C of the wide lead frame 70 is an imaginary line connecting the center of the wide lead frame 70 in the widthwise direction W, and extending in the lengthwise direction L.

Since the die attach process must be accurately performed, the attach head motion for moving the semiconductor chip should be very precise. The distance that the attach head can move on the wide lead frame 70 placed on the index rail 120 (not shown in FIG. 3) with required precision is referred to as an effective movement distance. Accordingly, when the width W of the wide lead frame 70 is greater than an effective movement distance WB of the attach head in the widthwise direction W, it is not possible to attach the semiconductor chip to all die pads 81 on the wide lead frame 70 with the required accuracy. The required accuracy is determined according to the type and specification of the wide lead frame 70 or the attached semiconductor chip. When the required accuracy is not met, the possibility of a complete semiconductor package to be defective is high.

When a semiconductor package manufacturing apparatus having an increased effective movement distance of the attach head is manufactured, excessive costs are needed. This is because a huge amount of cost is needed to develop and manufacture a precisely controlled equipment which can move a longer distance with high accuracy. Thus, a relatively higher cost is needed compared to the effects of the cost reduction and productivity improvement.

Figure 4:
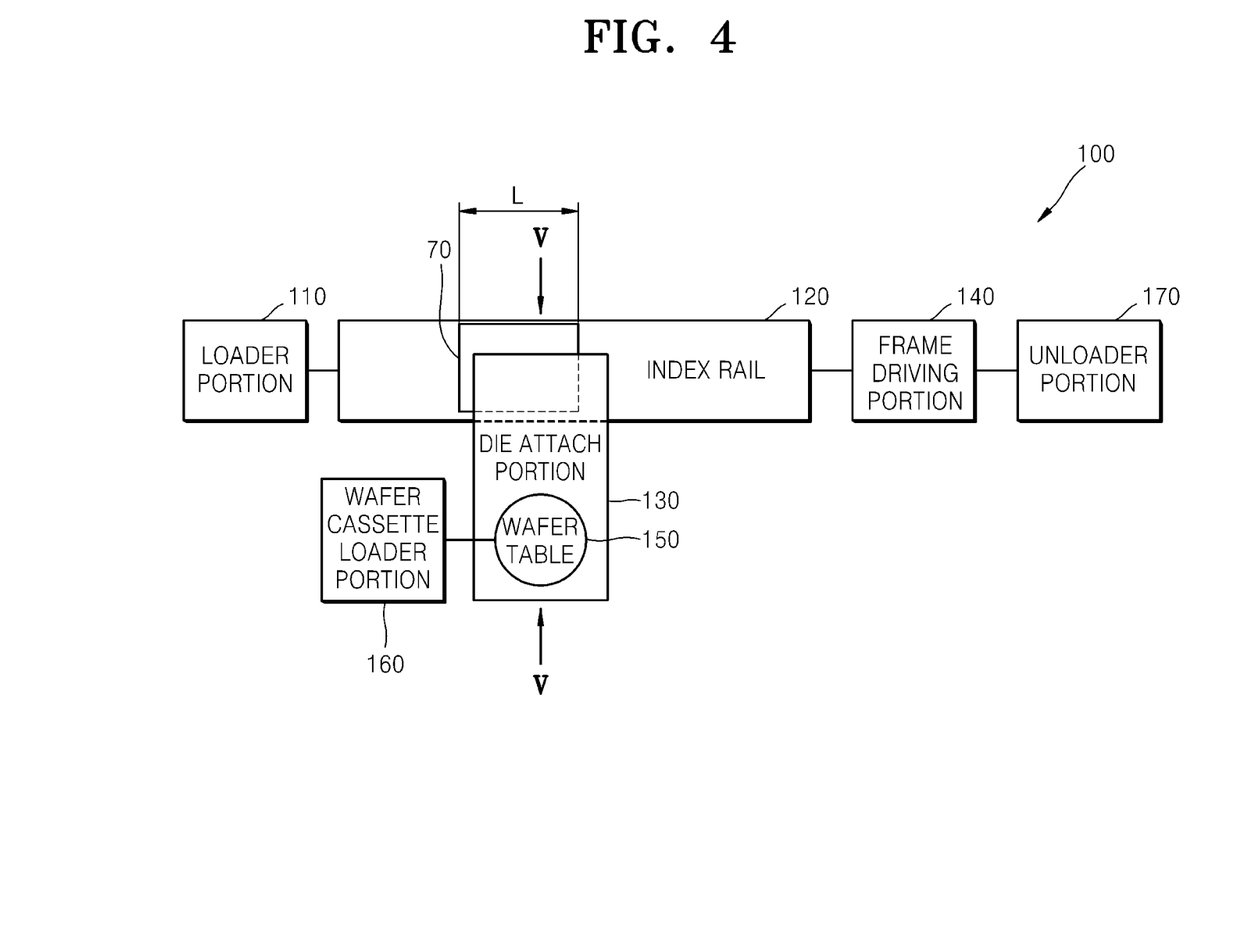
FIGS. 4 and 5 are, respectively, a plan view and a cross-sectional view of an apparatus for manufacturing a semiconductor package according to an embodiment of the present invention.

FIG. 4 is a plan view of an apparatus 100 for manufacturing a semiconductor package according to an embodiment of the present invention. Referring to FIG. 4, the apparatus 100 for manufacturing a semiconductor package includes a loader portion 110, an index rail 120, a die attach portion 130, and a frame driving portion 140. The loader portion 110 supplies the wide lead frame 70 contained in a magazine and containing a plurality of lead frames. The index rail 120 transfers the wide lead frame 70 supplied by the loader portion 110 to the frame driving portion 140. Therefore the wide lead frame 70 is moved in a lengthwise direction L. The die attach portion 130 attaches the semiconductor chip to the wide lead frame 70 that is being transferred.

The semiconductor chip attached to the wide lead frame 70 by the die attach portion 130 may be supplied by a wafer cassette loader portion 160 and a wafer table 150. A wafer having a plurality of semiconductor chips supplied by the wafer cassette loader portion 160 is placed on the wafer table 150. The wafer may be already separated into individual semiconductor chips when placed on the wafer table 150, or may be separated into individual semiconductor chips on the wafer table 150 after placed on the wafer table 150. That is, after an adhesive tape is attached to the rear surface of the wafer, the wafer may be placed on the wafer table 150 by being completely separated into individual semiconductor chips or by forming a groove between the individual semiconductor chips. Alternatively, after the wafer is placed on the wafer table 150 with the adhesive tape attached to the rear surface of the wafer, the semiconductor chips may be completely separated into individual semiconductor chips or a groove may be formed between the individual semiconductor chips. The interval between the individual semiconductor chips may be increased by expanding the adhesive tape. Also, vacuum pressure may be supplied to the wafer table 150 to detach the individual semiconductor chips from the adhesive tape.

The frame driving portion 140 may rotate the wide lead frame 70 transferred along the index rail 120 around a perpendicular line with respect to the upper or lower surface of the wide lead frame 70, or flip the wide lead frame 70 so that the upper surface of the wide lead frame 70 can face down. The frame driving portion 10 may have both rotating and flipping functions or one of these functions. The frame driving portion 140 may selectively rotate or flip the wide lead frame 70, or return the wide lead frame 70 to the index rail 120, according to the state of the wide lead frame 70.

The loader portion 110 may fill the magazine with the wide lead frame 70 having the semiconductor chips attached thereto and put the magazine away. Also, an unloader portion 170 is separately connected to the frame driving portion 140 to fill the magazine with the wide lead frame 70 having the semiconductor chips attached thereto and move the magazine away. That is, the loader portion 110 may have both loading and unloading functions or the unloader portion 170 having the unloading function may be separately used. When the unloader portion 170 is used, the frame driving portion 140 may selectively rotate or flip the wide lead frame 70, return the wide lead frame 70 to the index rail, or transfer the wide lead frame to the unloader portion 170, according to the state of the wide lead frame 70. In other words, whether to include the unloading function in the loader portion 110 or to separately connect the unloader portion 170 can be selectively determined according to a work efficiency such as work movement or convenience in distinguishing the wide lead frame 70 with die attachment from the wide lead frame 70 without die attachment.

Figure 5:
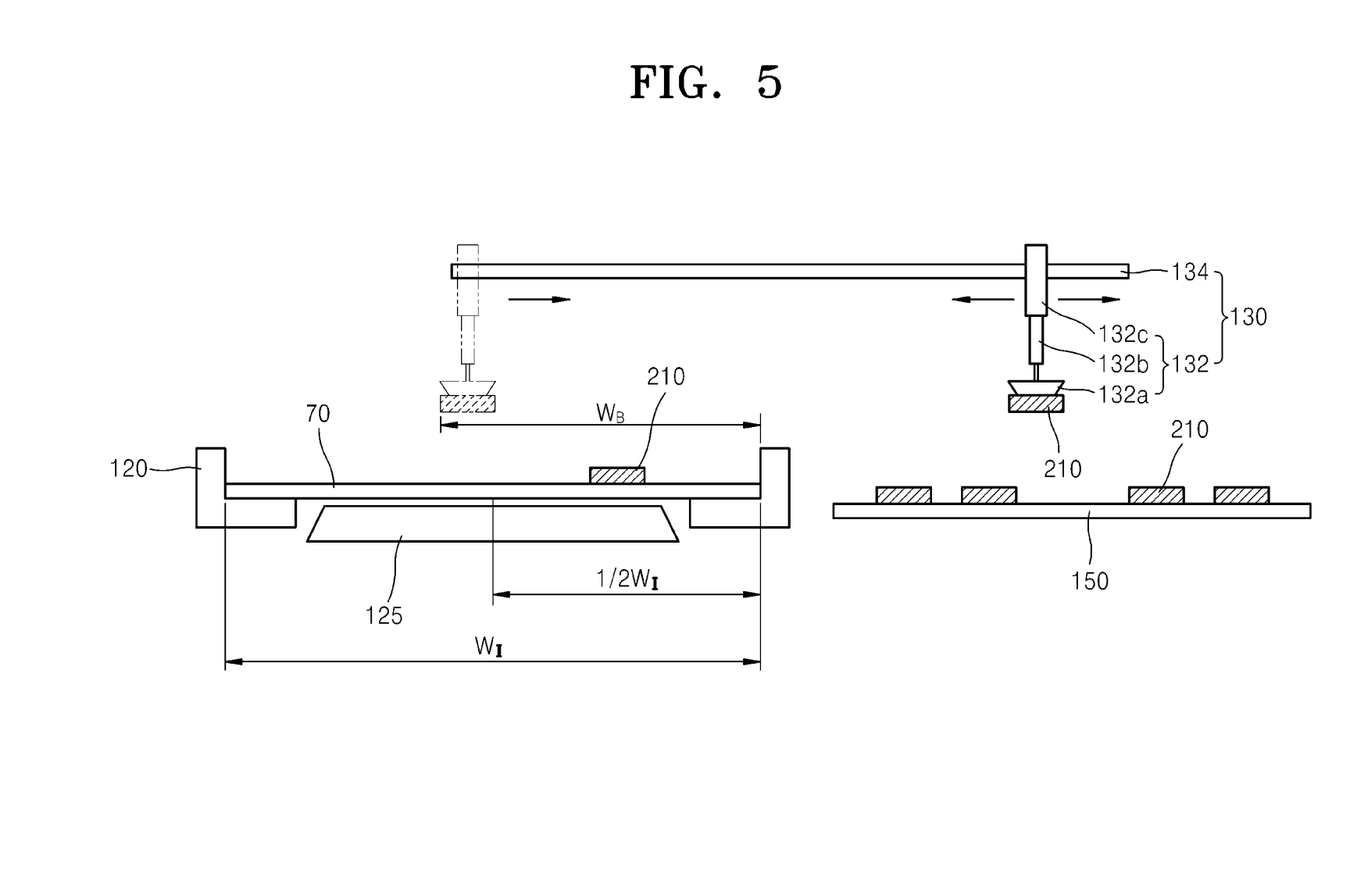

FIG. 5 is a cross-sectional view taken along line V-V of FIG. 4, illustrating an apparatus for manufacturing a semiconductor package according to an embodiment of the present invention. Referring to FIG. 5, the die attach portion 130 includes an attach head 132 and a transfer rail 134. The attach head 132 is transferred along the transfer rail 134 between the wafer table 150 and the wide lead frame 70 placed on the index rail 120. The width $W_I$ of the index rail 120 is dependent on the width of the wide lead frame 70 which can be placed on the index rail 120.

Referring to FIGS. 3 and 5, when the index rail 120 can accommodate the wide lead frame 70 having a variety of widths, the width $W_I$ of the index rail 120 denotes the width of a wide lead frame having the maximum width among any wide lead frames that can be placed on the index rail 120. Thus, the width $W_I$ of the index rail 120 is not less than the width W of the wide lead frame 70 ($W_I \geq W$). However, in the following description, for the convenience of explanation, the wide lead frame 70 denotes a wide lead frame having the maximum width that can be accommodated on the index rail 120. Accordingly, unless stated otherwise, the width $W_I$ of the index rail 120 is the same as the width W of the wide lead frame 70 ($W_I = W$).

The effective movement distance $W_B$ of the attach head 132 is from an end of the index rail 120 in the widthwise direction $W_I$ to at least the width centerline C of the wide lead frame 70 and does not cover the entire width W of the wide lead frame 70 ($W_I/2 \leqq W_B < W_I$). That is, although the attach head 132 can move with the required accuracy along the transfer rail 134 across the half of the width $W_I$ of the index rail 120, it cannot move across the entire width $W_I$ of the index rail 120 with the required accuracy. Thus, although the die attach portion 130 can attach a semiconductor chip 210 at least in one half portion of the wide lead frame 70 in the widthwise direction thereof, it cannot attach the semiconductor chip 210 entirely or partially in the other half portion of the width $W_I$ of the index rail 120.

In other words, although the die attach portion 130 can attach the semiconductor chip 210 on all die pads 81 existing between an end of the wide lead frame 70 in the widthwise direction and the width centerline C of the wide lead frame 70, it cannot attach the semiconductor chip 210 on all die pads 81 on the wide lead frame 70. Not being able to attach the semiconductor chip 210 signifies that it is not possible to attach the semiconductor chip 210 with the accuracy required by the wide lead frame 70, that is, within a predetermined error range.

The attach head 132 includes a chip sucking portion 132a sucking and moving the semiconductor chip 210, a pickup module 132b moving the chip sucking portion 132a up and down, and a head block portion 132c connecting the attach head 132 and the transfer block 134. Also, when the die attach portion 130 attaches the semiconductor chip 210 to the wide lead frame 70, a sucking block 125 supplies pressure or heat from under the wide lead frame 70 to facilitate the attachment of the semiconductor chip 210 to the wide lead frame 70.

Figure 6:
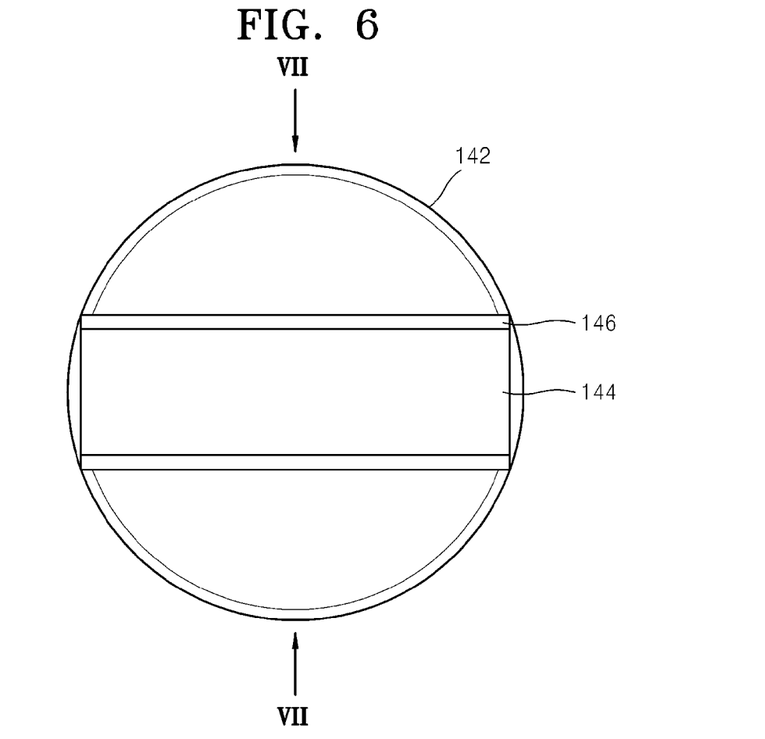
FIGS. 6 and 7 are, respectively, a plan view and a cross-sectional view of a rotary table according to an embodiment of the present invention.

FIG. 6 is a plan view of a rotary table 142 according to an embodiment of the present invention. Referring to FIGS. 4 and 6, the frame driving portion 140 includes the rotary table 142. A frame loading rail 144 supporting the wide lead frame 70 transferred from the index rail 120, one for each time, is coupled to the rotary table 142. A frame fixing apparatus 146 for pressing the wide lead frame 70 to fix it on the frame loading rail 144 may be further coupled to the frame loading rail 144. The wide lead frame 70 placed on the frame loading rail 144 can be rotated together with the rotary table 142.

Figure 7:
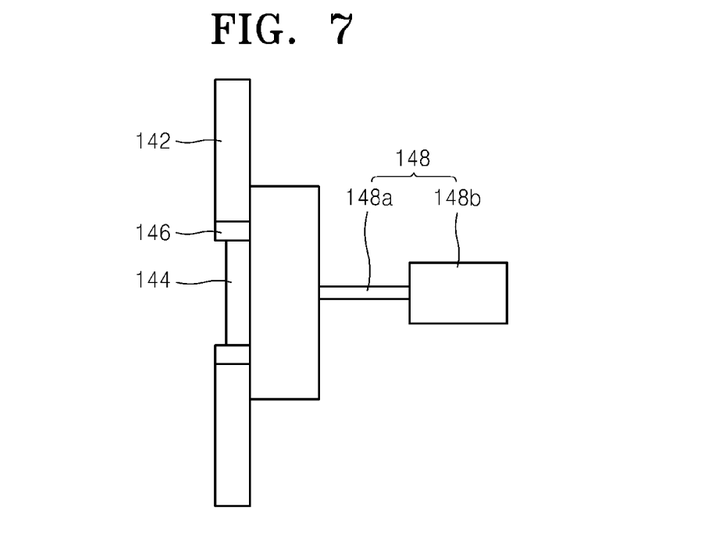

FIG. 7 is a cross-sectional view of the rotary table 142, taken along line VII-VII of FIG. 6. Referring to FIG. 7, a rotation apparatus 148 is connected to the low portion of the rotary table 142. The rotation apparatus 148 includes a rotational shaft 148a and a rotation driving apparatus 148b. The rotational shaft 148a is connected to the rotary table 142 in a direction along a normal to the upper surface of the frame loading rail 144 coupled to the rotary table 142, that is, the upper surface of the wide lead frame 70 placed on the frame loading rail 144. Thus, when the rotation driving apparatus 148b rotates the rotational shaft 148a, the frame loading rail 144 is rotated with the rotary table 142 so that the wide lead frame 70 can be rotated around a normal to the upper surface of the wide lead frame 70. The rotation driving apparatus 148b may provide a rotational driving force to the rotational shaft 148a using an air cylinder (not shown). Accordingly, the rotation apparatus 148 can smoothly rotate the wide lead frame 70 by 180°. However, the rotation apparatus 148 may rotate the wide lead frame 70 at a different angle according to the connection with peripheral devices. The direction of the rotation of the rotational shaft 148a may be selected according to necessity, for example, to the left or right with respect to the rotational shaft 148a.

Figure 8:
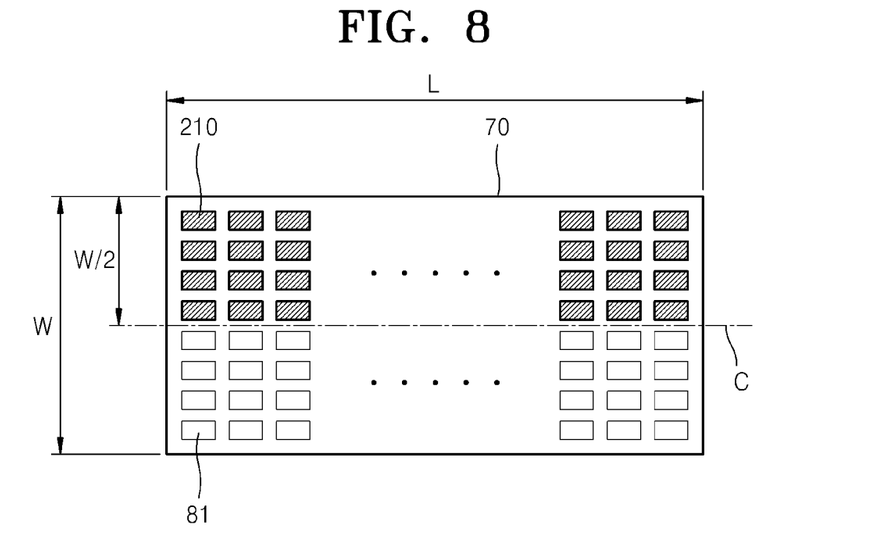
FIGS. 8-11 illustrate a die attach process according to an embodiment of the present invention.

FIGS. 8-11 illustrate a die attach process according to an embodiment of the present invention. FIG. 8 illustrates that the semiconductor chips 210 are attached on a portion of the upper surface of the wide lead frame 70. Referring to FIG. 8, the semiconductor chips 210 are attached to the die pads 81 existing in one half portion of the wide lead frame 70 with respect to the width centerline C. The semiconductor chips 210 may be attached on the one half portion and some of the die pads 81 existing in the other half portion of the wide lead frame 70. However, the semiconductor chips 210 may not be attached on all of the die pads 81 in the other half portion. The semiconductor chip 210 may be attached to the die pad 81 using an adhesive tape (not shown). After the semiconductor chips 210 are attached on all of the die pads 81 in the one half portion of the wide lead frame 70, the wide lead frame 70 is transferred to the frame driving portion 140.

In the following description, the expression that "the semiconductor chips 210 are attached on the one half portion of the wide lead frame 70" denotes that the semiconductor chips 210 are attached at least on all of the die pads 81 existing in the one half portion of the wide lead frame 70 with respect to the width centerline C and some of the die pads 81 existing in the other half portion of the wide lead frame 70, but not on all of the die pads 81 existing in the other half portion of the wide lead frame 70.

Figure 9:
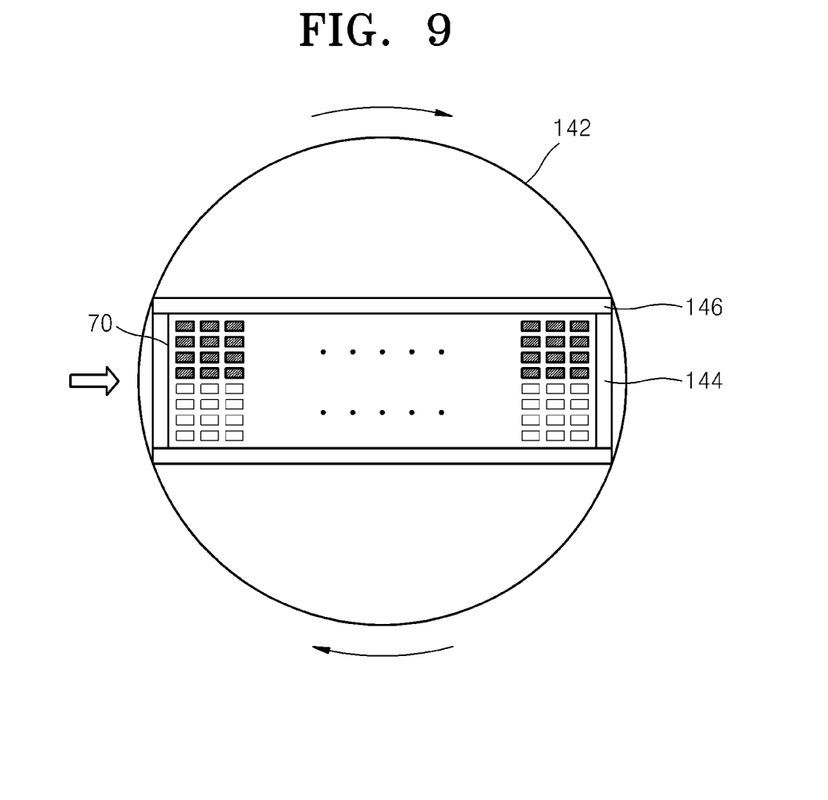

FIG. 9 illustrates a case where the wide lead frame 70 according to an embodiment of the present invention is rotated. Referring to FIG. 9, the wide lead frame 70 is placed on the frame loading rail 144 and may be pressed by the frame fixing apparatus 146 to be fixed on the frame loading rail 144. As the rotary table 142 rotates, the wide lead frame 70 rotates together.

Figure 10:
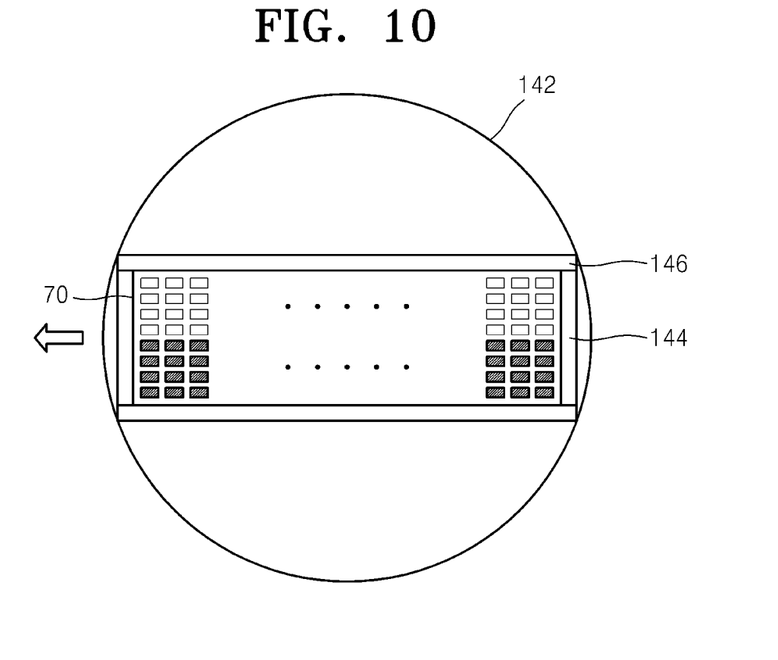

FIG. 10 illustrates a case where the wide lead frame 70 is rotated. Referring to FIG. 10, the wide lead frame 70 is rotated by 180° around a normal to the upper surface of the wide lead frame 70. Accordingly, the wide lead frame 70 is reversed such that the position of the one half portion of the wide lead frame 70 where the semiconductor chips 210 are all attached and the position of the other half portion of the wide lead frame 70 where the semiconductor chips 210 are partially or not at all attached are switched. Then, the wide lead frame 70 is supplied to the index rail 120.

Figure 11:
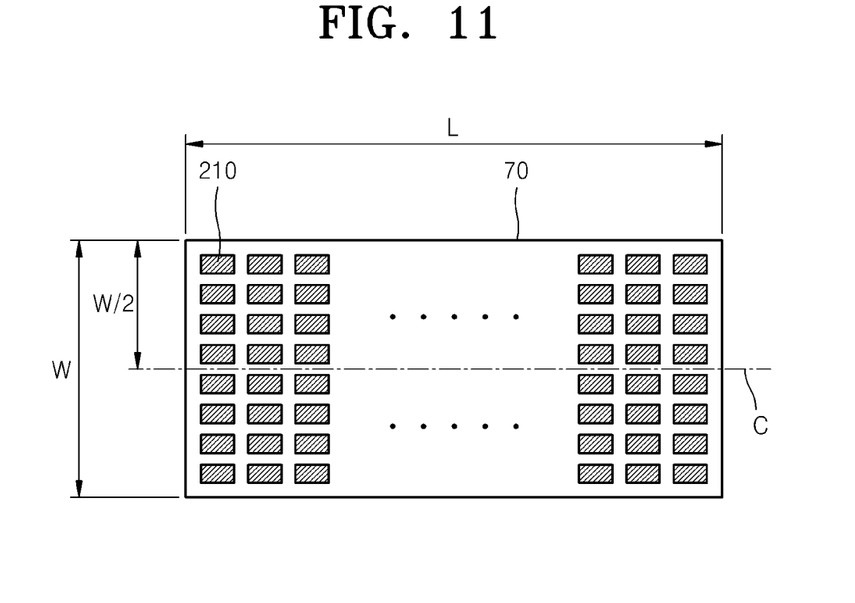

FIG. 11 illustrates that the semiconductor chips 210 are attached on the entire upper surface of the wide lead frame 70. Referring to FIG. 11, the wide lead frame 70 is transferred to the die attach portion 130 by means of the index rail 120. Since the portions of the wide lead frame 70 in the widthwise direction are switched because the wide lead frame 70 is rotated, the semiconductor chip 210 can be attached on the other half portion of the wide lead frame 70 where the semiconductor chip 210 is not attached on part or the entire surface of the wide lead frame 70. Thus, the semiconductor chip 210 can be attached on all of the die pads 81 on the upper surface of the wide lead frame 70.

The wide lead frame 70 on which the semiconductor chips 210 are attached on all of the die pads 81 is transferred to the loader portion 110 and unloaded or transferred to the unloader portion 170 via the frame driving portion 140 and unloaded. As a result, the die attach process can be performed for a wide lead frame having a relatively large width by using the die attach portion 130 that is suitable for a lead frame having a relatively narrow width and is also relatively cheap.

Figure 12:
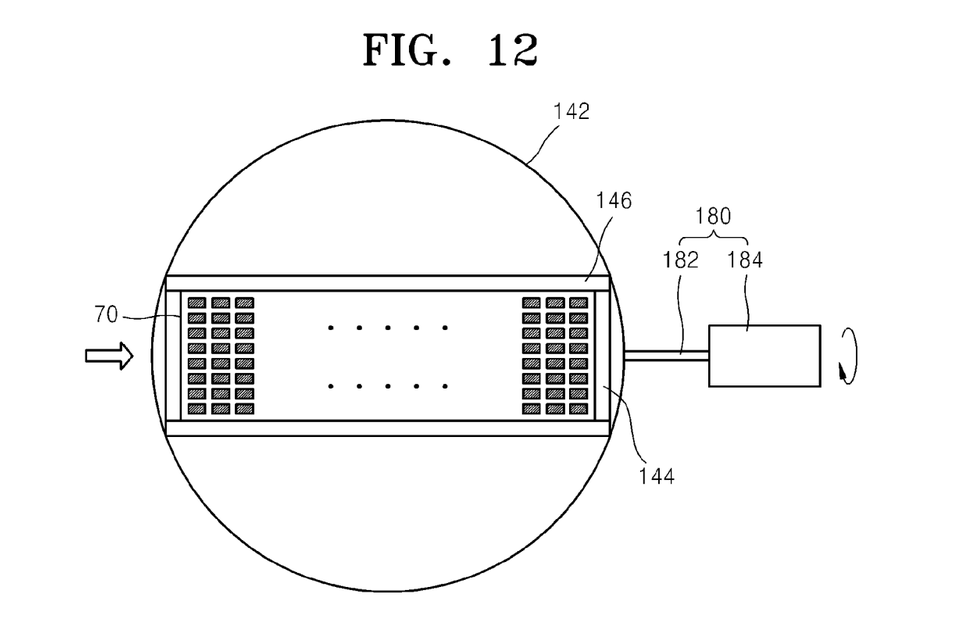
FIGS. 12 and 13 illustrate a die attach process according to another embodiment of the present invention.
Figure 13:
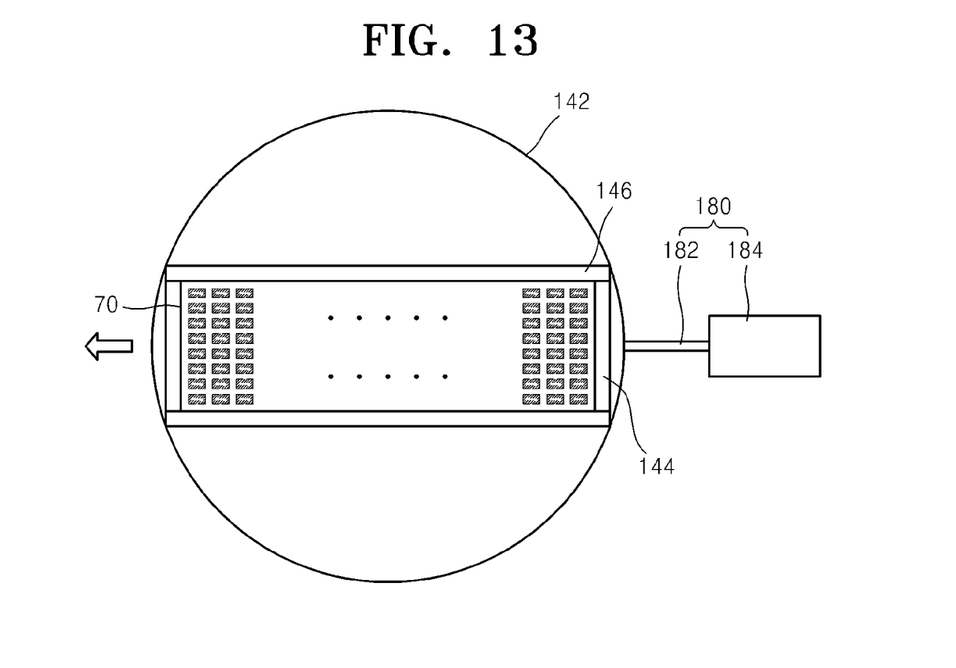

FIGS. 12 and 13 illustrate a die attach process according to another embodiment of the present invention. FIG. 12 illustrates that the semiconductor chips are attached on the upper surface of the wide lead frame according to another embodiment of the present invention. Referring to FIG. 12, a reversing apparatus 180 is connected to the frame loading rail 144 coupled to the rotary table 142 in the frame driving portion 140. The rotation apparatus 148 of FIG. 7 may be connected to the rotary table 142. That is, the frame driving portion 140 may include only the rotation apparatus 148, only the reversing apparatus 180, or both of the rotation apparatus 148 and the reversing apparatus 180, as necessary.

The reversing apparatus 180 includes a reversing rotational shaft 182 extending in a lengthwise direction of the wide lead frame 70 placed on the frame loading rail 144 and a reversing driving apparatus 184 connected to the reversing rotational shaft 182. When the reversing rotational shaft 182 is rotated by the reversing driving apparatus 184, the wide lead frame 70 placed on the frame loading rail 144 is reversed such that the upper surface of the wide lead frame 70 faces downward. Accordingly, the wide lead frame 70 is preferably pressed by the frame fixing apparatus 146 so as not to be separated from the frame loading rail 144.

FIG. 13 illustrates that the semiconductor chips 210 are attached on the lower surface of the wide lead frame 70 that is reversed. Referring to FIG. 13, the upper surface of the wide lead frame 70 reversed by the reversing apparatus 180 faces downward. Accordingly, the semiconductor chips 210 are attached on the lower surface of the wide lead frame 70. The wide lead frame 70 is supplied to the index rail 120 so that the semiconductor chips 210 are attached on the upper surface of the wide lead frame 70 where the semiconductor chips 210 are not attached.

Figure 14:
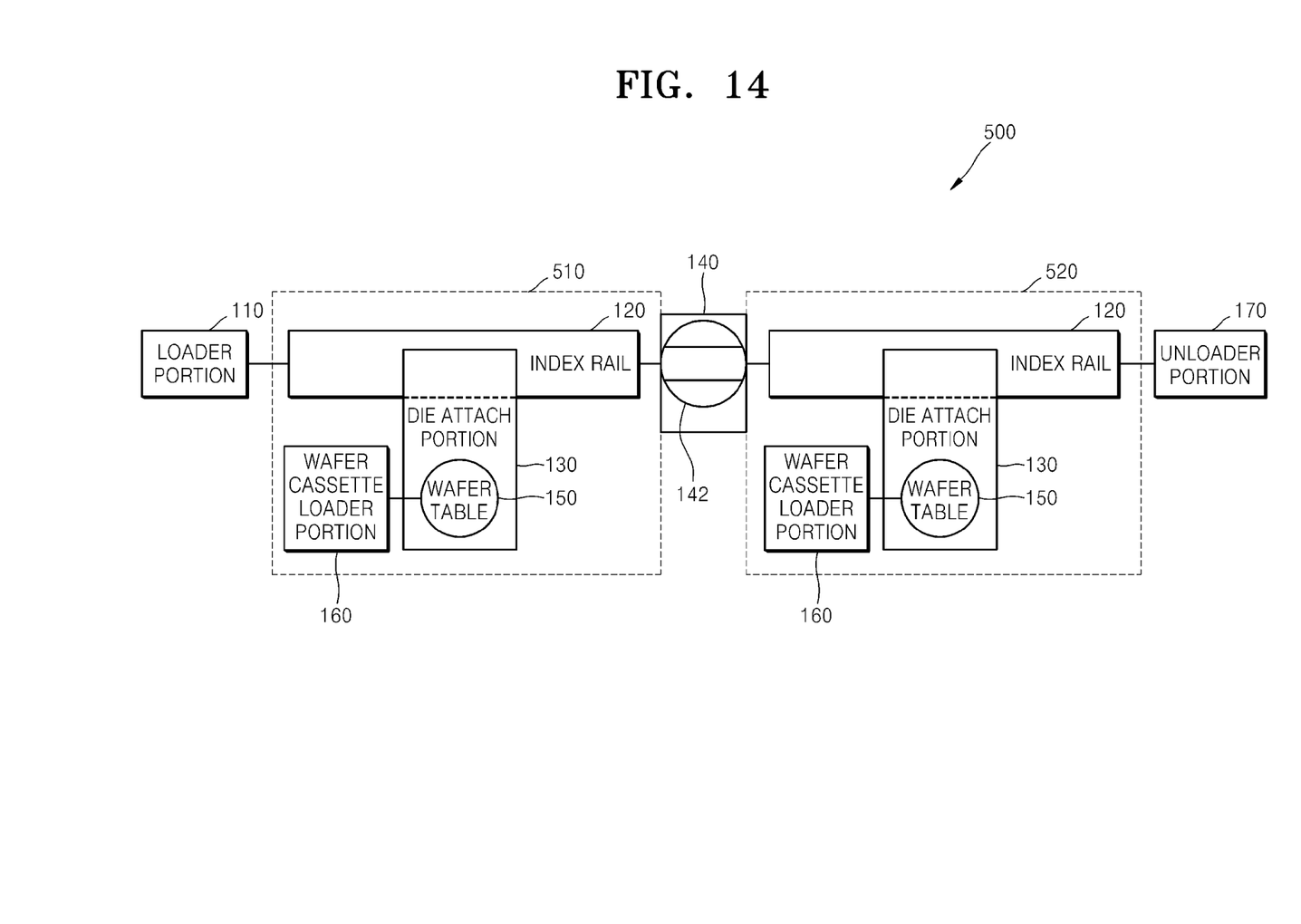
FIG. 14 is a plan view of an apparatus for manufacturing a semiconductor package according to another embodiment of the present invention.

FIG. 14 is a plan view of an apparatus for manufacturing a semiconductor package according to another embodiment of the present invention. Referring to FIG. 14, a semiconductor package manufacturing apparatus 500 includes the loader portion 110, a first die attach apparatus 510, the frame driving portion 140, and a second die attach apparatus 520. The semiconductor package manufacturing apparatus 500 may include the unloader portion 170. Each of the first and second die attach apparatuses 510 and 520 includes the index rail 120 and the die attach portion 130. Also, each of the first and second die attach apparatuses 510 and 520 may include the wafer cassette loader portion 160 and the wafer table 150. Since the loader portion 110, the index rail 120, the die attach portion 130, the frame driving portion 140, the wafer table 150, the wafer cassette loader portion 160, and the unloader portion 170 are the same as those of FIGS. 4-13, detailed descriptions thereof will be omitted herein. Also, the first and second die attach apparatuses 510 and 520 have the same structure.

In the semiconductor package manufacturing apparatus 500, the loader portion 110 supplies the wide lead frame 70 to the first die attach apparatus 510. The first die attach apparatus 510 attaches the semiconductor chips 210 on one half portion of the upper surface of the wide lead frame 70. Then, the wide lead frame 70 is rotated around a normal to the upper surface of the wide lead frame 70 in the frame driving portion 140 and supplied to the second die attach apparatus 520. The second die attach apparatus 520 attaches the semiconductor chips 210 on all of the die pads 81 on the upper surface of the wide lead frame 70 where the semiconductor chips 210 are not attached. The wide lead frame 70 on which the semiconductor chips 210 are all attached is exhausted via the unloader portion 170.

Alternatively, a semiconductor package manufacturing apparatus can be configured by serially connecting a plurality of die attach apparatuses, each including the index rail 120 and the die attach portion 130, thereby performing the die attach process.

Also, although it is not illustrated in the drawings, a die attach apparatus including the index rail 120 and the die attach portion 130, the loader portion 110, the frame driving portion 140, and the unloader portion 170 are combined as necessary to configure various types of semiconductor package manufacturing apparatuses. For example, a semiconductor package manufacturing apparatus can be configured by sequentially combining the loader portion 110 having an unloading function, the first die attach apparatus 510, the frame driving portion 140 having a rotation function, the second die attach apparatus 520, and the frame driving portion 140 having a reversing function. In this case, the loader portion 110 supplies the wide lead frame 70. The semiconductor chips 210 are attached on one half portion of a first surface of the wide lead frame 70 in the first die attach apparatus 510. The semiconductor chips 210 are attached on the other half portion of the first surface in the second die attach apparatus 520. Then, the wide lead frame 70 is reversed by the frame driving portion 140 having a reversing function so that the first surface faces downward. The semiconductor chips 210 are attached on one half portion of a second surface of the wide lead frame 70 in the second die attach apparatus 520. The wide lead frame 70 is rotated by the frame driving portion 140 having a rotation function. The semiconductor chips 210 are attached on the other half portion of the second surface in the first die attach apparatus 510. Then, the wide lead frame 70 is unloaded by the loader portion 110 having an unloading function. Thus, the semiconductor chips 210 can be die attached entirely on both surfaces of the wide lead frame 70.

In another example, a loader portion having an unloading function, a first die attach apparatus, a first frame driving portion having a rotation function, a second die attach apparatus, a second frame driving portion having a reversing function, a third die attach apparatus, a third frame driving portion having a rotation function, a fourth die attach apparatus, and an unloader portion are sequentially connected so that the semiconductor chips 210 can be die attached entirely on both surfaces of the wide lead frame 70.

Although in the above description the semiconductor chips are die attached on the die pads on the wide lead frame, the present invention is not limited thereto. That is, the present invention can be applied to a multi-chip packaging technique for attaching a plurality of semiconductor chips in layers on a single die pad. The present invention can be applied to a case in which a plurality of semiconductor chips are attached forming a layer and then other semiconductor chips are attached on the layer, forming another layer.

According to the apparatus and method of manufacturing a semiconductor package according to the present invention, die attach can be performed to a wide lead frame at a relatively low cost while maintaining high precision. Thus, the cost of raw materials can be saved and productivity can be improved. Also, during the die attachment on the wide lead frame, since the wide lead frame does not need to be manually reversed by an operator, work time can be shortened and a defect rate can be reduced.

Furthermore, since the configuration of an apparatus can be freely modified according to the type of a desired semiconductor package, for example, multi-chip packaging or double-sided packaging, the apparatus can be efficiently used in spite of the change of a product or a packaging technique and it is possible to quickly respond to the change in market.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:
1. An apparatus for manufacturing a semiconductor package, the apparatus comprising:

an index rail transferring a lead frame in forward and backward directions, the lead frame having a first surface and a second surface that is opposite to the first surface;
a loader portion connected to a first end portion of the index rail and supplying the lead frame to the index rail;
a frame driving portion connected to a second end portion opposite of the first end portion of the index rail and rotating the lead frame around a normal to the first surface; and
a die attach portion attaching a semiconductor chip on the first surface of the lead frame supplied to the index rail.

2. The apparatus of claim 1, wherein the die attach portion comprises:
an attach head picking the semiconductor chip up and attaching the semiconductor chip to the lead frame; and
a transfer rail transferring the attach head over the index rail.

3. The apparatus of claim 2, wherein the attach head moves along the transfer rail in a widthwise direction of the index rail from one side of the index rail in the widthwise direction at least to the center position of the width of the index rail.

4. The apparatus of claim 1, further comprising an unloading portion connected to the frame driving portion to exhaust the lead frame to the outside of the apparatus, wherein the frame driving portion selectively transfers the lead frame to the unloading portion or supplies the lead frame back to the index rail according to the state of the lead frame.

5. The apparatus of claim 1, wherein, to rotate the lead frame around a normal to the first surface, the frame driving portion comprises:
a frame loading rail supporting the lead frame;
a rotary table supporting the frame loading rail;
a rotational shaft connected to the rotary table in a direction along the normal to the first surface; and
a rotation driving apparatus supplying a rotation driving force to the rotation shaft.

6. The apparatus of claim 5, wherein the frame loading rail supports the lead frame so that the frame driving portion rotates the lead frame once for each time the lead frame is loaded on the frame driving portion.

7. The apparatus of claim 1, wherein the frame driving portion rotates the lead frame by 180°.

8. The apparatus of claim 1, wherein the loader portion has an unloading function to exhaust the lead frame transferred from the index rail to outside of the apparatus.

9. The apparatus of claim 1, wherein the frame driving portion further comprises a reversing apparatus which reverses the lead frame so that one surface facing upward from the first and second surfaces of the lead frame faces downward.

10. An apparatus for manufacturing a semiconductor package, the apparatus comprising:
a first die attach apparatus and a second die attach apparatus, each comprising an index rail transferring a lead frame having a first surface and a second surface that is opposite to the first surface in forward and backward directions and a die attach portion attaching a semiconductor chip on the first surface of the lead frame placed on the index rail;
a loader portion connected to a first end portion of the first die attach apparatus and supplying the lead frame to the first die attach apparatus;
an unloader portion connected to a second end portion of the second die attach apparatus and exhausting the lead frame from the second die attach apparatus; and
a frame driving portion connected between a third and a fourth end portions opposite of the first and second end portions, respectively, of the first and second die attach apparatuses and rotating the lead frame around a normal to the first surface.

11. The apparatus of claim 10, wherein the die attach portion comprises:
an attach head picking the semiconductor chip up and attaching the semiconductor chip to the lead frame; and
a transfer rail transferring the attach head over the index rail.

12. The apparatus of claim 11, wherein the attach head moves along the transfer rail in a widthwise direction of the index rail from one side of the index rail in the widthwise direction at least to the center position of the width of the index rail.

13. The apparatus of claim 10, wherein the frame driving portion selectively transfers the lead frame to the first die attach apparatus or the second die attach apparatus according to the state of the lead frame.

14. The apparatus of claim 13, wherein the frame driving portion further comprises a reversing apparatus which reverses the lead frame so that one surface facing upward from among the first and second surfaces of the lead frame faces downward.

15. A method of manufacturing a semiconductor package, the method comprising:
supplying a lead frame having a first surface having a plurality of die pads and a second surface opposite to the first surface, with the first surface facing upward, to a die attach portion, wherein the lead frame is moved in a first direction;
attaching a semiconductor chip in some of the die pads on the first surface of the lead frame in the die attach portion (a first die attach operation);
rotating the lead frame around a normal to the first surface; and
attaching a semiconductor chip in the rest of the die pads on the first surface of the lead frame where a semiconductor chip is not attached, in the die attach portion (a second die attach operation).

16. The method of claim 15, wherein, in the first die attach operation, the semiconductor chips are attached on all of the die pads displaced at least in a half portion with respect to a centerline, extending in the first direction, of the first surface.

17. The method of claim 15, wherein, in the second die attach operation, the semiconductor chips are attached on all of the die pads displaced at least in a half portion with respect to a centerline, extending in the first direction, of the first surface.

18. The method of claim 15, further comprising:
reversing the lead frame so that the second surface of the lead frame faces upward, wherein the second surface has a plurality of die pads;
attaching a semiconductor chip in some of the die pads on the second surface of the lead frame in the die attach portion (a third die attach operation);
rotating the lead frame around a normal to the second surface; and
attaching a semiconductor chip in the rest of the die pads on the second surface of the lead frame where a semiconductor chip is not attached, in the die attach portion (a fourth die attach operation).

19. The method of claim 18, wherein, in the third die attach operation, the semiconductor chips are attached on all of the die pads displaced at least in a half portion with respect to a centerline, extending in the first direction, of the second surface.

20. The method of claim 18, wherein, in the fourth die attach operation, the semiconductor chips are attached on all of the die pads displaced at least in a half portion with respect to a centerline, extending in the first direction, of the second surface.

* * * * *